United States Patent
Zeng et al.

(10) Patent No.: US 11,521,419 B2
(45) Date of Patent: Dec. 6, 2022

(54) DISPLAY DEVICE AND FINGERPRINT RECOGNITION METHOD

(71) Applicant: SHANGHAI TIANMA MICRO-ELECTRONICS CO., LTD., Shanghai (CN)

(72) Inventors: Yang Zeng, Shanghai (CN); Feng Lu, Shanghai (CN); Haochi Yu, Shanghai (CN); Xiaoyue Su, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 138 days.

(21) Appl. No.: 16/731,072

(22) Filed: Dec. 31, 2019

(65) Prior Publication Data

US 2021/0064837 A1 Mar. 4, 2021

(30) Foreign Application Priority Data

Aug. 29, 2019 (CN) .......................... 201910810555.5

(51) Int. Cl.
| | | |
|---|---|---|
| *G06V 40/13* | (2022.01) | |
| *G09G 3/3225* | (2016.01) | |
| *G06V 10/141* | (2022.01) | |
| *G06V 10/147* | (2022.01) | |
| *H01L 27/32* | (2006.01) | |

(52) U.S. Cl.
CPC ........ *G06V 40/1318* (2022.01); *G06V 10/141* (2022.01); *G06V 10/147* (2022.01); *G09G 3/3225* (2013.01); *H01L 27/3227* (2013.01)

(58) Field of Classification Search
CPC .. G06K 9/0004; G06K 9/00013; G06F 3/042; G06F 3/0421; H01L 27/3234; H01L 27/3227
See application file for complete search history.

(56) References Cited

U.S. PATENT DOCUMENTS

| | | | | |
|---|---|---|---|---|
| 2003/0189656 A1* | 10/2003 | Shinohara | .............. | H04N 5/369 |
| | | | | 348/E3.018 |
| 2006/0011913 A1* | 1/2006 | Yamazaki | ........... | H01L 27/1214 |
| | | | | 257/59 |
| 2006/0208981 A1* | 9/2006 | Rho | ..................... | G09G 3/3648 |
| | | | | 345/88 |
| 2008/0087803 A1* | 4/2008 | Yamamoto | ........ | H01L 27/14678 |
| | | | | 250/226 |
| 2012/0162167 A1* | 6/2012 | Kurokawa | ............ | G06F 3/0412 |
| | | | | 345/207 |
| 2015/0311258 A1* | 10/2015 | Kim | ...................... | H01L 27/307 |
| | | | | 257/40 |

(Continued)

FOREIGN PATENT DOCUMENTS

| | | |
|---|---|---|
| CN | 107025422 A | 8/2017 |
| CN | 107590428 A | 1/2018 |

(Continued)

*Primary Examiner* — Yuzhen Shen
(74) *Attorney, Agent, or Firm* — Kilpatrick Townsend & Stockton, LLP

(57) ABSTRACT

A display device and a fingerprint recognition method are provided. The fingerprint recognition device includes at least two photosensitive regions receiving different colors of light, and the color of the light received by one photosensitive region corresponds to the emitted color of the light emitting sub-pixel in one color.

17 Claims, 10 Drawing Sheets

(56) References Cited

U.S. PATENT DOCUMENTS

| | | | | |
|---|---|---|---|---|
| 2018/0012069 A1* | 1/2018 | Chung | ............... | G06V 40/1365 |
| 2018/0089491 A1* | 3/2018 | Kim | ................... | G06K 9/00912 |
| 2019/0050621 A1* | 2/2019 | Xu | ....................... | G06K 9/0004 |
| 2019/0108382 A1 | 4/2019 | Dumont | | |
| 2020/0394371 A1* | 12/2020 | Chai | ................... | G06V 40/1318 |
| 2020/0410202 A1* | 12/2020 | Lin | .................... | G06V 40/1394 |
| 2021/0366990 A1* | 11/2021 | Tang | ................... | H01L 27/3211 |

FOREIGN PATENT DOCUMENTS

| | | | |
|---|---|---|---|
| CN | 107871447 A | | 4/2018 |
| CN | 107918768 A | | 4/2018 |
| CN | 107958185 A | | 4/2018 |
| CN | 108537090 A | | 9/2018 |
| CN | 108573983 A | | 9/2018 |
| CN | 109858434 A | | 6/2019 |
| KR | 100994239 B1 | | 11/2010 |

\* cited by examiner

DISPLAY DEVICE AND FINGERPRINT RECOGNITION METHOD

CROSS-REFERENCES TO RELATED APPLICATIONS

This application claims priority to Chinese patent application No. 201910810555.5 filed on Aug. 29, 2019, which is incorporated herein by reference in its entirety.

FIELD

The disclosure relates to the field of display technologies and particularly to a display device and a fingerprint recognition method.

BACKGROUND

The fingerprint recognition technology has been widely used in the smart phone, attendance machine, security access control, customs clearance of port and other fields. Generally, the fingerprint sensor is configured to receive the light reflected by the finger and convert the light into an electrical signal. Thus the fingerprint information of the finger can be determined according to the converted electrical signal. However, due to the process condition limitation, the size of the fingerprint sensor is limited to some extent, so that the number of the fingerprint sensors per device area cannot be further increased any more, which is not conducive to implementing the fingerprint recognition function with the high resolution and thus not conducive to the increase in the fineness of the identified fingerprint.

SUMMARY

The embodiments of the disclosure provide a display device and a fingerprint recognition method.

An embodiment of the disclosure provides a display device, which includes: a first base substrate and a fingerprint recognition structure located at a backlight side of the first base substrate;

a plurality of light emitting sub-pixels in different colors and a plurality of via holes for pin-hole imaging located on a light-emitting side of the first base substrate;

wherein the fingerprint recognition structure includes: a plurality of fingerprint recognition devices; and at least one of the fingerprint recognition devices includes: at least two photosensitive regions receiving different colors of light; and the color of light received by one photosensitive region corresponds to the emitted color of a light emitting sub-pixel in one color.

An embodiment of the disclosure further provides a fingerprint recognition method of the display device, which includes:

controlling light emitting sub-pixels of which the color is same as the color of light received by the photosensitive regions to be lightened, and the light emitted by the light emitting sub-pixels is reflected by a finger and passes through the via holes into the photosensitive regions corresponding to the color; and detecting electrical signals of the fingerprint recognition devices when controlling light emitting sub-pixels in same color to be lightened simultaneously, and the light emitting sub-pixels in same color are lightened at same time, and light emitting sub-pixels in different colors are lightened at different time;

determining an initial fingerprint image corresponding to the photosensitive regions in each color according to the detected electrical signals of the fingerprint recognition device;

determining a fingerprint image of the finger according to the initial fingerprint image corresponding to the photosensitive regions in each color.

DETAILED DESCRIPTION

Figure 1:
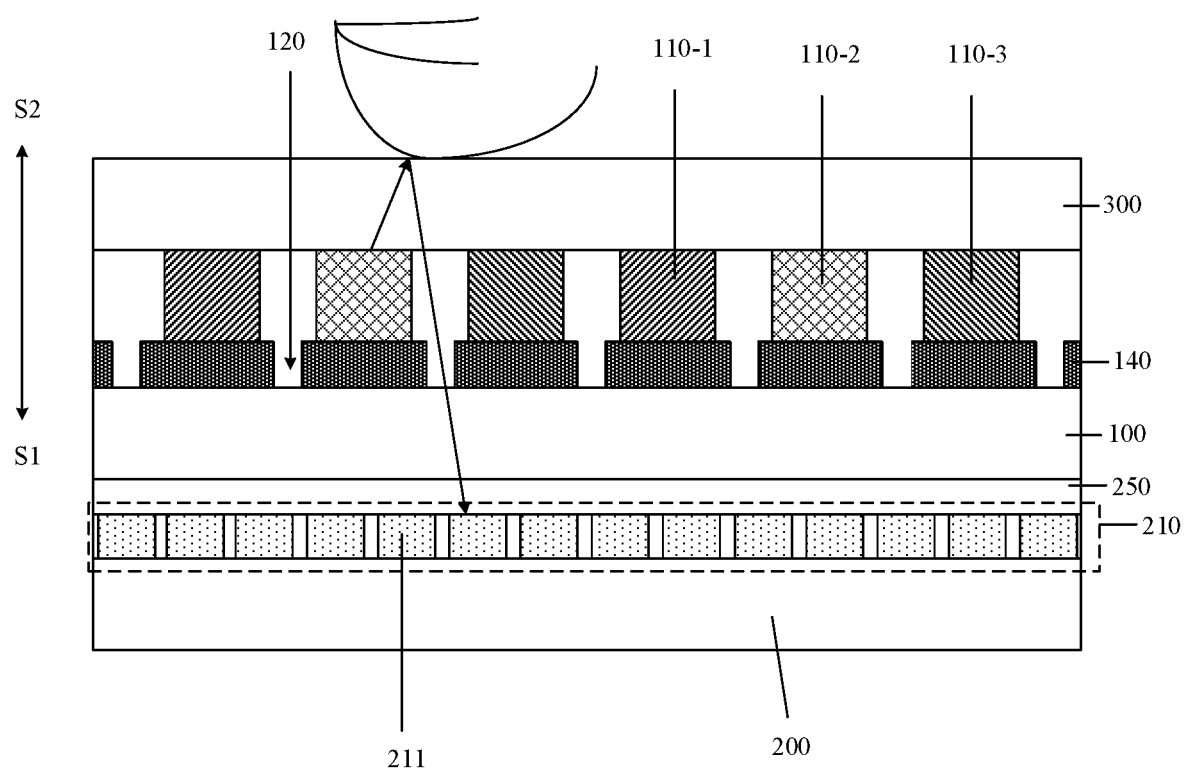
FIG. 1 is a schematic structural diagram of a display device according to an embodiment of the disclosure.

It should be noted that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Generally, the fingerprint recognition technologies mainly include: capacitive fingerprint recognition technology, radio frequency fingerprint recognition technology, and optical fingerprint recognition technology. The fingerprint is detected by the pin-hole imaging principle in the optical fingerprint recognition technology. In one embodiment, in the practical application, the photosensors are arranged in the same layer, to receive the light reflected by the finger and convert the light into the electrical signal through the photosensors, so that the converted electrical signal can be gathered to determine the fingerprint information of the finger according to the gathered electrical signal. Since the image formed by the fingerprint through the pinhole is the reduced image, the photosensors need to have the relatively high Pixels Per Inch (PPI) in order to make the obtained fingerprint of the finger clearer. In one embodiment, the photosensors need to have the PPI above 700~1000, that is, the size of a single photosensor needs to be below 35~25 um.

However, for the silicon-based photosensor, it is easier to manufacture the single photosensor with the size being below 25 um. But since the price of the silicon-based photosensor is very high, more silicon-based photosensors are required when the fingerprint recognition needs to be performed in the large area of the display device. This will lead to a substantial increase in cost, and is not conducive to the competitiveness of the display device. In order to solve this problem, the Thin Film Transistor (TFT) photosensor based on the glass substrate can be used. However, due to the process condition limitation, the size of the TFT photosensor is difficult to be below 25 um, which is not conducive to implementing the fingerprint recognition function with the high resolution (e.g., above 700 PPI) and thus not conducive to the increase in the fineness of the recognized fingerprint.

In view of this, an embodiment of the disclosure provides a display device. As shown in FIGS. 1-5, the display device can include: a first base substrate 100 and a fingerprint recognition structure 210 located at the backlight side (i.e., the side pointed by the arrow 51) of the first base substrate 100; a plurality of light emitting sub-pixels 110-$m$ ($1 \leq m \leq M$, m and M are the integers, and M represents the total number of the colors of the light emitting sub-pixels, In one embodiment M=3 in FIG. 1) in different colors and a plurality of via holes 120 for implementing the pin-hole imaging located at the light-emitting side (i.e., the side pointed by the arrow S2) of the first base substrate 100. The fingerprint recognition structure 210 can include: a plurality of fingerprint recognition devices 211; and each fingerprint recognition device 211 can include: at least two photosensitive regions B-n ($1 \leq n \leq N$, n and N are both the integers, and N represents the total number of the photosensitive regions in one fingerprint recognition device. In one embodiment N=2 in FIG. 1) receiving different colors of light; and the color of the light received by one photosensitive region B-n corresponds to the emitted color of the light emitting sub-pixel in one color.

In the above display device according to the embodiment of the disclosure, each fingerprint recognition device includes at least two photosensitive regions for receiving different colors of light, and the color of the light received by one photosensitive region corresponds to the emitted color of the light emitting sub-pixel in one color. During the fingerprint recognition, the light emitting sub-pixel of which the color is same as the color of the light received by each photosensitive region can be controlled to be lightened, so that the photosensitive regions in one color receives the light reflected by the finger once and generates an electrical signal once. One fingerprint recognition device has N photosensitive regions, so one fingerprint recognition device can receive the light reflected by the finger N times and thus can generates the electrical signals N times. Thus, the effect of N-times fingerprint recognition devices can be achieved by arranging only one fingerprint recognition device without extra addition of the fingerprint recognition devices, to and increase the PPI (Pixels Per Inch) of the fingerprint recognition and then increase the fingerprint recognition precision.

Figure 6:
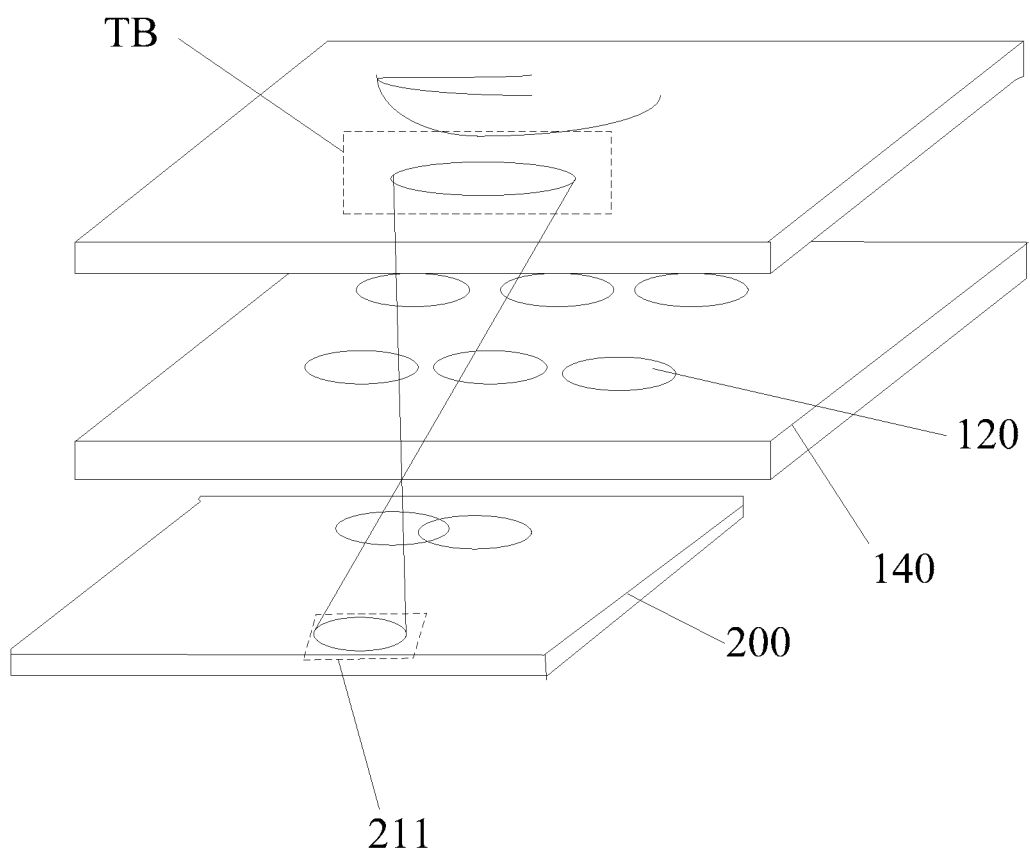
FIG. 6 is a schematic diagram of a stacked structure of the display device in the related art.

It should be noted that the inventor found that when one fingerprint recognition device is provided with only one photosensitive region, the fingerprint recognition device is detected at least twice, which cannot implement the effect in the embodiments of the disclosure. As shown in FIG. 6, since one fingerprint recognition device 211 corresponds to one specific region TB of the finger fingerprint, it is assumed that one fingerprint recognition device 211 is provided with only one photosensitive region, then after the light is reflected by the finger fingerprint and enters the photosensitive region of the fingerprint recognition device 211, the signal detected firstly in the fingerprint recognition device 211 is the average sum of the electrical signals converted from all the light received by one photosensitive region corresponding to the fingerprint recognition device 211, so the firstly detected signal carries the fingerprint information of the specific region TB. The signal detected secondly in the fingerprint recognition device 211 still is the average sum of the electrical signals converted from all the light received by one photosensitive region corresponding to the fingerprint recognition device 211, so the secondly detected signal carries the fingerprint information of the above specific region TB of the fingerprint. Since the specific region TB corresponds to a certain region of the finger fingerprint, there is no much difference between the firstly signal and secondly detected signal, so that the signals detected twice are equivalent to the signal detected once.

Figure 7:
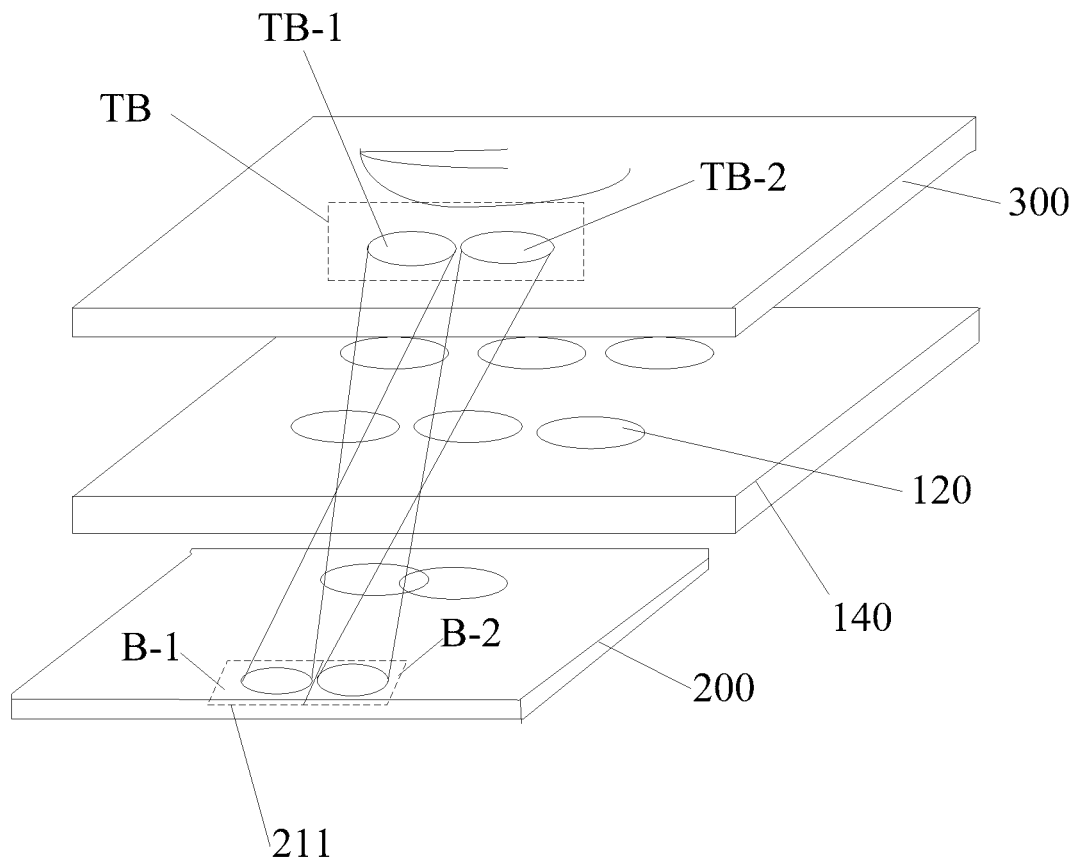
FIG. 7 is a schematic diagram of a stacked structure of the display device according to an embodiment of the disclosure.
Figure 8:
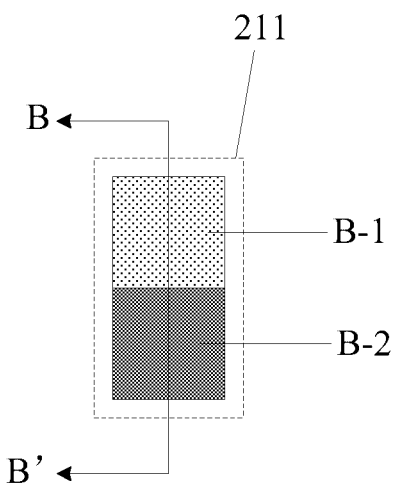
FIG. 8 is a top-view of one fingerprint recognition device according to an embodiment of the disclosure.

However, in the display device according to an embodiment of the disclosure, as shown in FIG. 7, In one embodiment, one fingerprint recognition device is correspondingly provided with two photosensitive regions: a first photosensitive region B-1 and a second photosensitive region B-2. Since one fingerprint recognition device 211 corresponds to a specific region TB of the finger fingerprint, the specific region TB may be divided into two specific sub-regions TB-1 and TB-2: a first specific sub-regions TB-1 corresponding to the first photosensitive region B-1 and a second specific sub-regions TB-2 corresponding to the second photosensitive region B-2. Thus after the light is reflected by the finger fingerprint and enters the first photosensitive region B-1 of the fingerprint recognition device 211, the firstly detected signal is the average sum of the electrical signals converted from all the light received by the first photosensitive region B-1 corresponding to the fingerprint recognition device 211, so the firstly detected signal carries the fingerprint information of the first specific sub-region TB-1 of the fingerprint described above. The secondly detected signal is the average sum of the electrical signals converted from all the light received by the second photosensitive region B-2 corresponding to the fingerprint recognition device 211, so the secondly detected signal carries the fingerprint information of the second specific sub-region TB-2 of the fingerprint. Since the first specific sub-region TB-1 and the second specific sub-region TB-2 of the fingerprint have the difference, the signals detected twice also have the difference. Therefore, one fingerprint recognition device 211 can output two electrical signals with the difference, and then the fingerprint recognition is performed according to the detected signals, to and improve the PPI of the fingerprint recognition and then improve the fingerprint recognition capability.

Figure 2:
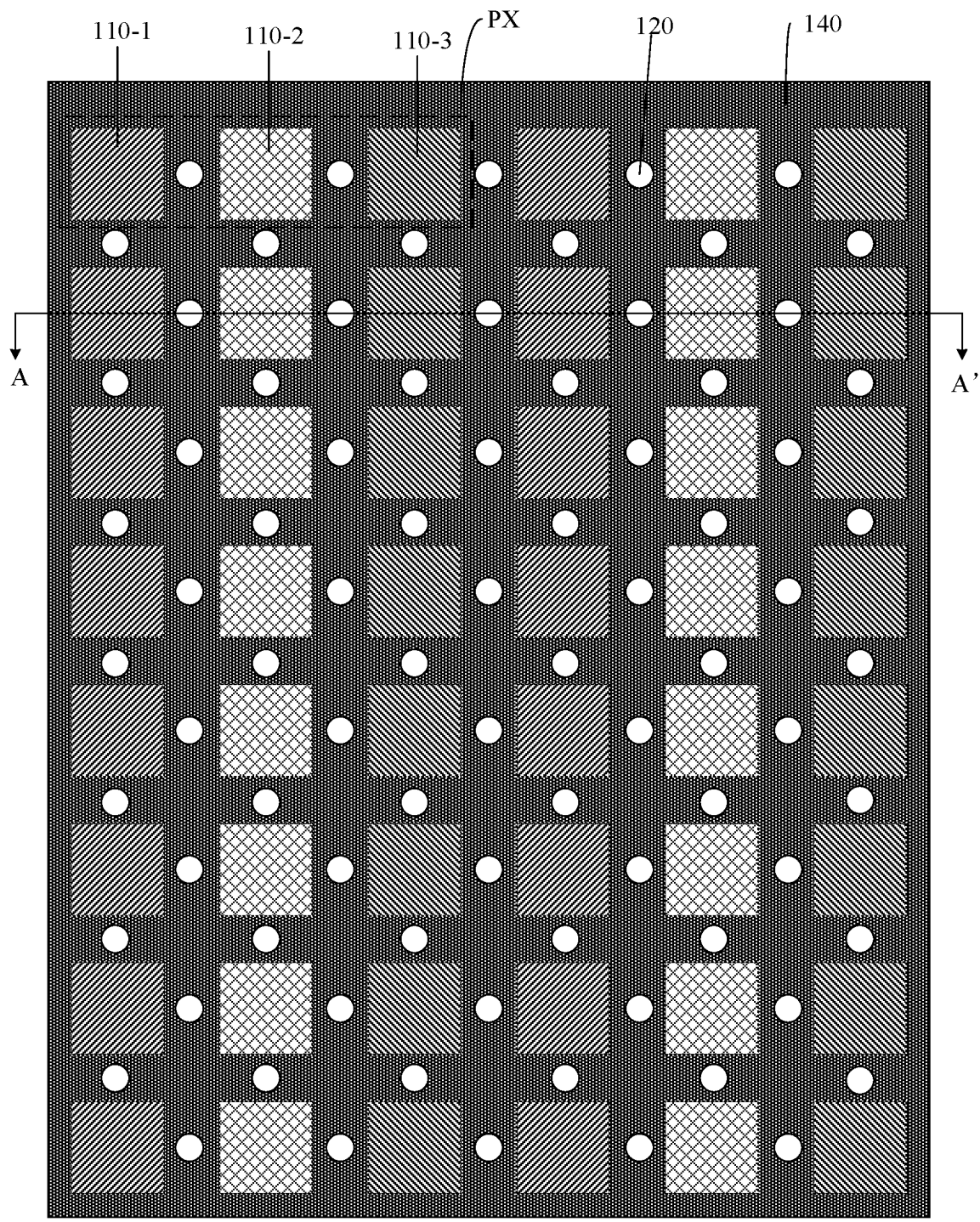
FIG. 2 is a top-view of a first base substrate according to an embodiment of the disclosure.
Figure 3:
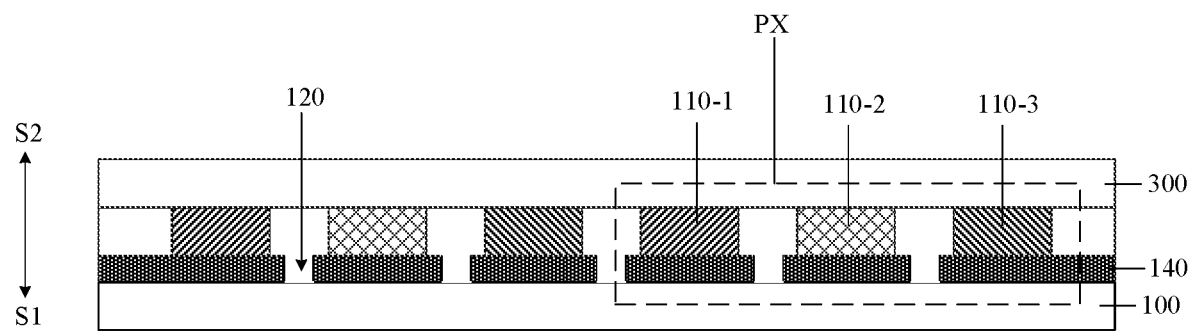
FIG. 3 is a section-view of the first base substrate shown in FIG. 2 along the AA' direction.

In an implementation and in an embodiment of the disclosure, the display device has a display region. As shown in FIGS. 2 and 3, a plurality of pixel devices PX are arranged in the display region and on the first base substrate 100. One pixel device PX includes a plurality of light emitting sub-pixels 110-$m$ in different colors, to mix the colors through these light emitting sub-pixels 110-$m$ in different colors and display image. Exemplarily, the pixel device PX can include: a light emitting sub-pixel 110-1 in first color, a light emitting sub-pixel 110-2 in second color, and a light emitting sub-pixel 110-3 in third color. In one embodiment, the first, second and third colors can be selected from the red, green and blue, and the image display function is implemented by mixing the red, green and blue. In one embodiment, the first color is red, the second color is green, and the third color is blue. Of course, the disclosure is not limited thereto.

In an implementation and in an embodiment of the disclosure, the fingerprint recognition region may be the display region. Thus the whole display region can implement the fingerprint recognition. Of course, the fingerprint recognition region may be a part of the display region, or the fingerprint recognition region may be located in the non-display region, which is not limited here.

In an implementation and in an embodiment of the disclosure, at least one sub-pixel can include a light emitting element and a pixel driving circuit for driving the light emitting element to emit the light. Where the pixel driving circuit may include a switch transistor, a drive transistor and a storage capacitor. The light emitting element can include at least one of the Organic Light Emitting Diode (OLED), Quantum Dot Light Emitting Diode (QLED) and Micro Light Emitting Diode (Micro LED). The following is illustrated in the case that the light emitting device is the OLED In one embodiment.

In an implementation and in an embodiment of the disclosure, as shown in FIGS. 1, 3 and 7, the display device can further include: a protective cover plate 300 at the side of the layer of the light emitting sub-pixels 110-$m$ away from the first base substrate 100, to protect the light emitting sub-pixels 110-$m$ on the first base substrate 100. In the practical application, the OLEDs in the light emitting sub-pixels 110-$m$ emit the light, and the light is reflected by the finger and passes through the via holes 120 into the photosensitive region of corresponding color of the fingerprint recognition device 211.

In an implementation and in an embodiment of the disclosure, as shown in FIGS. 1-3, the orthographic projections of the via holes 120 on the first base substrate 100 do not overlap with the orthographic projections of the light emitting sub-pixels 110-$m$ on the first base substrate 100, which can prevent the light emitted by the light emitting sub-pixels 110-$m$ from affecting the photosensors.

In an implementation and in an embodiment of the disclosure, as shown in FIGS. 1-3, the display device can further include: a second light-shielding layer 140 located between the layer of the light emitting sub-pixels 110-$m$ and the first base substrate 100. The second light-shielding layer 140 is provided with the via holes 120. The orthographic projection of the second light-shielding layer 140 on the first base substrate 100 covers the orthographic projections of the light emitting sub-pixels 110-$m$ on the first base substrate 100. Thus, the light emitting sub-pixels 110-$m$ can be shielded by the second light-shielding layer 140, which can prevent the light emitted by the light emitting sub-pixels 110-$m$ from affecting the photosensors.

In an implementation and in an embodiment of the disclosure, the color of the light received by one photosensitive region corresponds to the emitted color of the light emitting sub-pixel of one color, which can mean the corresponding arrangement in the same color. In one embodiment, the emitted color of the red light emitting sub-pixel is red, so the color of the light received by the photosensitive region corresponding to the red light emitting sub-pixel is red. The emitted color of the green light emitting sub-pixel is green, so the color of the light received by the photosensitive region corresponding to the green light emitting sub-pixel is green. The emitted color of the blue light emitting sub-pixel is blue, so the color of the light received by the photosensitive region corresponding to the blue light emitting sub-pixel is blue.

Figure 4:
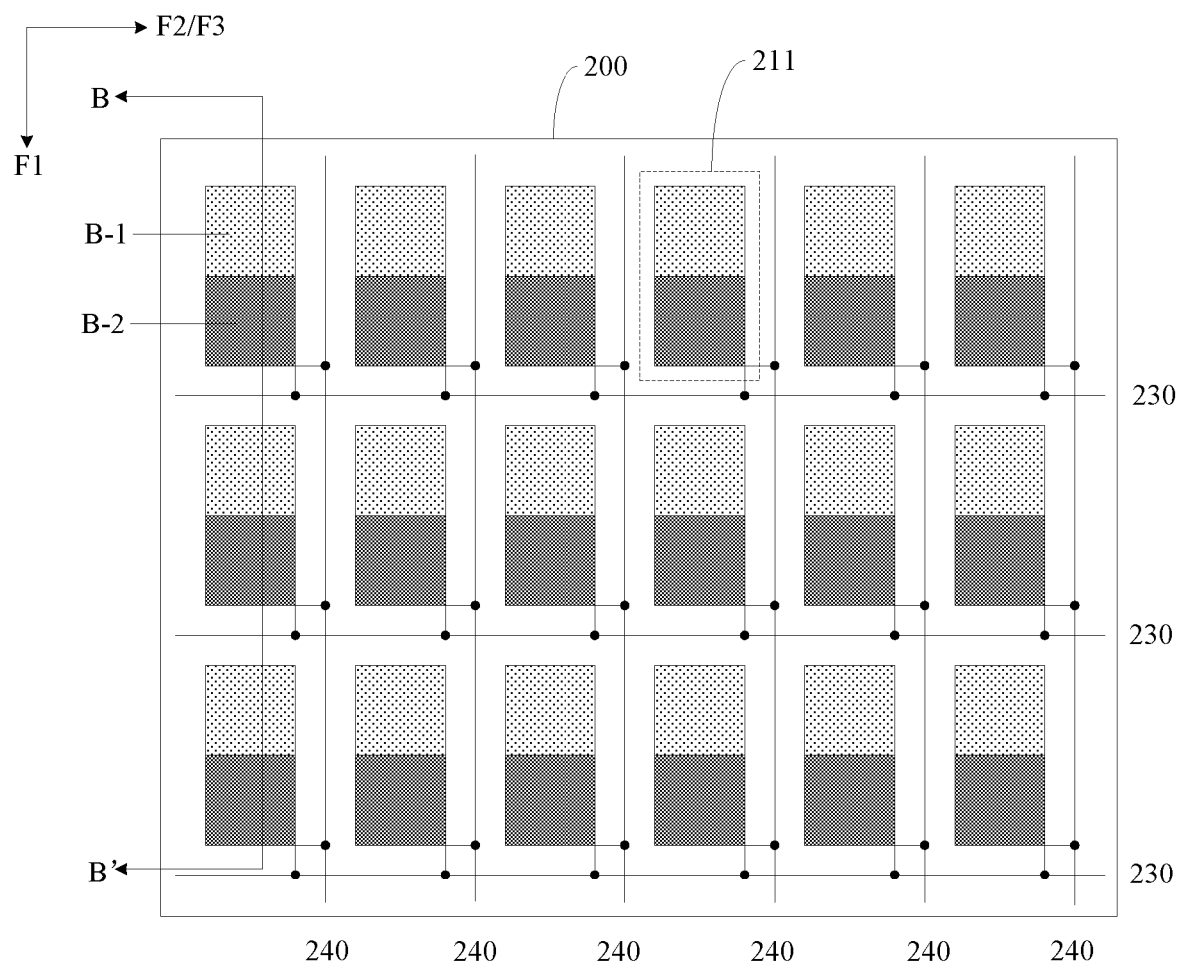
FIG. 4 is a top-view of some second base substrates according to an embodiment of the disclosure.

In an implementation and in an embodiment of the disclosure, as shown in FIG. 4, the areas of the photosensitive regions B-$n$ may be substantially the same. Thus it is easier to design the photosensitive regions in each fingerprint recognition device. Of course, the areas of the photosensitive regions in same color are same, and the areas of the photosensitive regions in different colors are different. In the practical application, it may be designed and determined according to the practical application environment, which is not limited here.

In an implementation and in an embodiment of the disclosure, as shown in FIGS. 1, 4, 5 and 9, the fingerprint recognition structure 210 can further include: a second base substrate 200 bearing the fingerprint recognition devices 211. At least one fingerprint recognition device 211 can include: a photosensor 212 and a detection transistor 213 located on the second base substrate 200. In the same fingerprint recognition device 211, the orthographic projection of the photosensor 212 on the second base substrate 200 covers the orthographic projections of at least two photosensitive regions B-$n$ on the second base substrate 200. In this way, the light incident to the photosensitive regions B-$n$ can enter the photosensor 212. Exemplarily, the layer of the detection transistor 213 is between the layer of the photosensor 212 and the second the base substrate 200.

In an implementation, at least one of the first and second base substrates can include a glass substrate. Thus, in the practical application, the detection transistor 213 and the photosensor 212 can be manufactured by using the method of manufacturing the TFT photosensor based on the glass substrate. Further one fingerprint recognition device 211 is provided with at least two photosensitive regions in the embodiments of the disclosure, so that the TFT photosensor based on the glass substrate can achieve the high PPI performance of the silicon-based photosensor.

Figure 9:
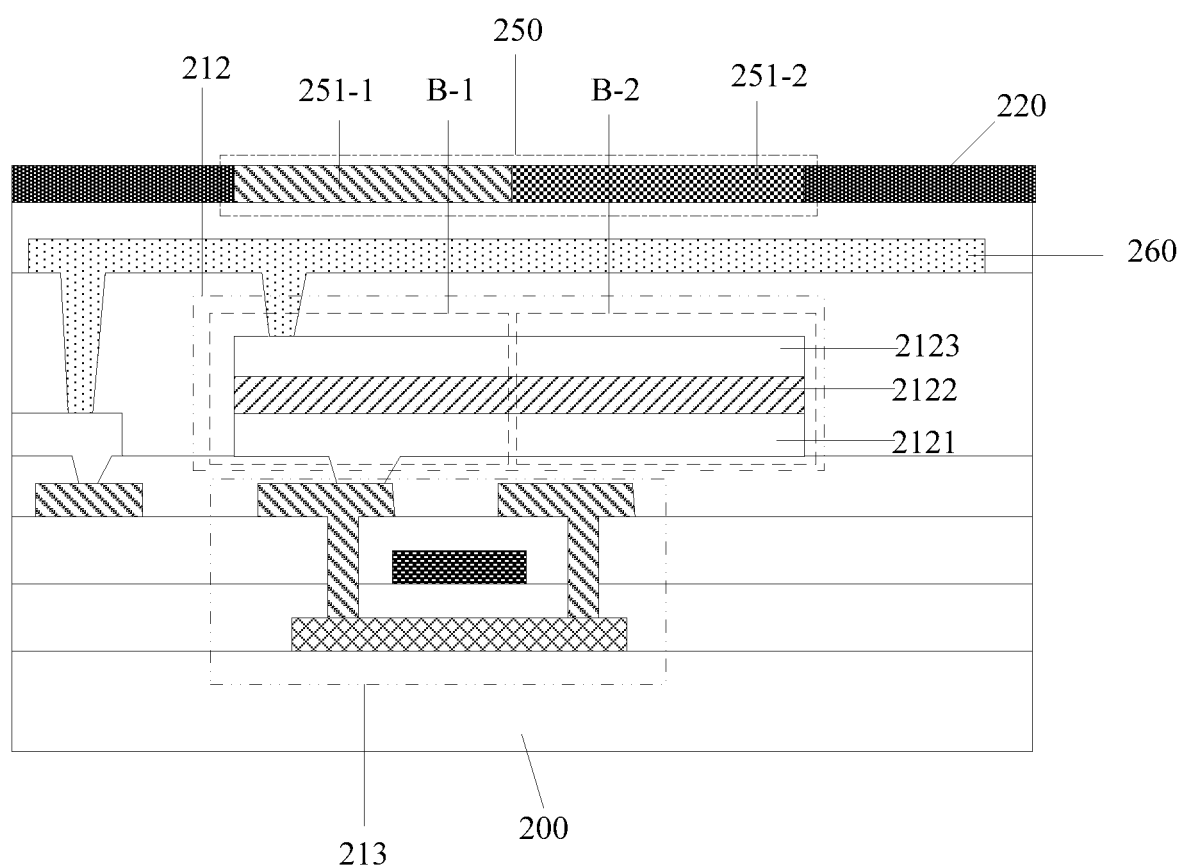
FIG. 9 is a partial section-view of the fingerprint recognition device shown in FIG. 8.

In an implementation and in an embodiment of the disclosure, as shown in FIG. 9, the photosensor 212 can include: a first electrode 2121, a photoelectric conversion layer 2122 and a second electrode 2123 stacked on the second base substrate 200. The first electrode 2121 may be located between the second base substrate 200 and the photoelectric conversion layer 2122, and the second electrode 2123 may be located at the side of the photoelectric conversion layer 2122 away from the second base substrate 200. In the same fingerprint recognition device 211, the orthographic projection of the photoelectric conversion layer 2122 on the second base substrate 200 covers the orthographic projections of at least two photosensitive regions B-$n$ on the second base substrate 200. In this way, the light incident to the photosensitive regions B-$n$ can enter the photoelectric conversion layer 2122.

In an implementation, the second electrode 2123 may be a transparent electrode. In this way, the light reflected by the finger can pass through the second electrode 2123 into the photoelectric conversion layer 2122 as much as possible. Exemplarily, the material of the second electrode 2123 may be the transparent conductive material, e.g., Indium Tin Oxide (ITO) material, Indium Zinc Oxide (IZO) material, carbon nanotube or graphene or the like, which is not limited here.

In an implementation, the first electrode 2121 may be a reflecting electrode. Since the light incident to the photoelectric conversion layer may pass through the photoelectric conversion layer and emit, this part of light passing through the photoelectric conversion layer can be reflected to the photosensor by arranging the first electrode 2121 as the reflecting electrode, so that all the light incident to the photoelectric conversion layer is received by the photoelectric conversion layer as possible, to and improve the photoelectric conversion efficiency of the photoelectric conversion layer. Exemplarily, the material of the first electrode 2121 may be the metal material, e.g., gold, silver, copper, aluminum or the like, which is not limited here.

In an implementation and in an embodiment of the disclosure, as shown in FIGS. 1 and 9, the fingerprint recognition structure 210 can further include: a color resistance layer 250 located between the layer of the fingerprint recognition devices 211 and the first base substrate 100. The color resistance layer 250 includes: the color resistance structures 251-$n$ one-to-one corresponding to the photosensitive regions B-n; and the color resistance structure 251-$n$ has the same color as the color of the light received by the corresponding photosensitive region B-n, and the orthographic projection of the color resistance structure 251-$n$ on the first base substrate 100 covers the orthographic projection of the corresponding photosensitive region B-n on the first base substrate 100. In this way, the light reflected by the finger can be filtered by the color resistance layer, so that the light of corresponding color among the light reflected by the finger can be incident into the corresponding photosensitive region, and thus the color of the light entering the photoelectric conversion layer in the fingerprint recognition device where this photosensitive region is located is purer, to increase the accuracy of the detected electrical signal.

In an implementation, the orthographic projection of the color resistance structure 251-$n$ on the first base substrate 100 and the orthographic projection of the fingerprint recognition device 211 on the first base substrate 100 have the overlap areas. In the practical application, the light of different color may be incident on the photosensitive regions B-n. Since the color resistance structure 251-$n$ is close to the fingerprint recognition device 211, the fingerprint recognition device in the orthographic projection region of each color resistance structure 251-$n$ is divided into different photosensitive regions B-n correspondingly. When the light reflected by the finger passes through different color resistance structures 251-$n$, the light signal may reach the corresponding photosensitive region, to enable the light signal passing through the corresponding color resistance structure 251-$n$ be sensed in the corresponding photosensitive region and thus obtain the fingerprint information of the corresponding region.

In an implementation and in an embodiment of the disclosure, the color resistance structure may include the color resistance material. In one embodiment, the color of the color resistance structure corresponding to the photosensitive region receiving the red light is red, so the color resistance material forming the color resistance structure is the red color resistance material. The color of the color resistance structure corresponding to the photosensitive region receiving the green light is green, so the color resistance material forming the color resistance structure is the green color resistance material. The color of the color resistance structure corresponding to the photosensitive region receiving the blue light is blue, so the color resistance material forming the color resistance structure is the blue color resistance material.

And in the practical application, due to the relatively mature process of manufacturing the color resistance material and the consideration based on the cost, the color resistance structure for filtering the light is possibly manufactured by the color resistance material in an embodiment of the disclosure.

Of course, in an embodiment of the disclosure, the color resistance structure for filtering the light may also have other arrangements. In an implementation, the fingerprint recognition structure can further include: a Bragg reflector layer located between the layer of the fingerprint recognition devices and the first base substrate. The Bragg reflector layer can include: Bragg reflectors one-to-one corresponding to the photosensitive regions; and the color of the Bragg reflector is the same as the color of the light received by the corresponding photosensitive region, and the orthographic projection of the Bragg reflector on the first base substrate covers the orthographic projection of the corresponding photosensitive region on the first base substrate. The arrangement of the Bragg reflectors is substantially the same as that of the color resistance structures, which is not repeated here.

In an implementation, the Bragg reflector contains an adjustable multilayer structure composed of two optical materials. In the practical application, In one embodiment, the photosensitive region receiving the red light may correspond to the red bandpass Bragg reflector. The photosensitive region receiving the green light may correspond to the green bandpass Bragg reflector. The photosensitive region receiving the blue light may correspond to the blue bandpass Bragg reflector. In the practical application, the structure of the Bragg reflector may be designed according to the practical application environment, which is not limited here.

Of course, in an implementation and in an embodiment of the disclosure, the thickness of the photoelectric conversion layer may also be set. Exemplarily, the thicknesses of the photoelectric conversion layers corresponding to different photosensitive regions are different. In one embodiment, the thickness of the photoelectric conversion layer corresponding to the photosensitive region receiving the red light is larger than the thickness of the photoelectric conversion layer corresponding to the photosensitive region receiving the green light. In the practical application, the thickness of the photoelectric conversion layer may be designed according to the practical application environment, so that different photosensitive regions receive the light of different colors. The thickness is not limited here.

In an implementation and in an embodiment of the disclosure, as shown in FIG. 9, the orthographic projection of the color resistance structure on the first base substrate may coincide with the orthographic projection of the corresponding photosensitive region on the first base substrate. In this way, the color of the light entering the photoelectric conversion layer in the fingerprint recognition device where this photosensitive region is located is purer, to further improve the accuracy of the detected electrical signal.

In an implementation and in an embodiment of the disclosure, as shown in FIGS. 4, 5, 8 and 9, the fingerprint recognition device 211 can have a first photosensitive region B-1 and a second photosensitive region B-2. The color of the light received by the first photosensitive region B-1 corresponds to the emitted color of the light emitting sub-pixels of the first color, and the color of the light received by the second photosensitive region B-2 corresponds to the emitted color of the light emitting sub-pixels of the second color. Exemplarily, the color of the light received by the first photosensitive region B-1 is red, that is, the first photosensitive region B-1 corresponds to the red light emitting sub-pixels 110-1. The color of the light received by the second photosensitive region B-2 is green, that is, the second photosensitive region B-2 corresponds to the green light emitting sub-pixels 110-2. In the fingerprint recognition process, the light emitted by the light emitting sub-pixel irradiates on the finger, is reflected by the finger, and then passes through the layers on the first base substrate 100 and the first base substrate 100 into the photoelectric conversion layer. Comparing with the red light and green light, the blue light has the low transmittance. When the finger is irradiated using the blue light emitting sub-pixel, there is more light loss after the light is reflected by the finger and when the light passes through the layers on the first base substrate 100 and the first base substrate 100, which causes the light incident into the photoelectric conversion layer to be attenuated more, and thus is not conducive to the fingerprint recognition detection.

Further compared with the red and green OLEDs, the blue OLED has a poorer lifetime. Therefore, if the blue OLED is used more times, the lifetime of the blue OLED may attenuate more quickly, to and reduce the display effect of the display device. And in the embodiments of the disclosure, the red and green OLEDs as configured as the light sources of the fingerprint recognition, the red OLED and green OLED may be attenuated additionally in the process of the normal attenuation of the normal light-emitting display of the red, green and blue OLEDs, so that the red, green and blue OLEDs can further have the consistent attenuation as possible, to and improve the display effect of the display device.

In an implementation and in an embodiment of the disclosure, as shown in FIG. 4, a plurality of fingerprint recognition devices 211 may be arranged in an array, that is, the fingerprint recognition devices 211 are arranged in an array on the second base substrate 200. Exemplarily, the photosensitive regions B-n in the same fingerprint recognition device 211 are arranged successively in the first direction F1. In one embodiment, the first direction F1 may be the column direction, and the first photosensitive region B-1 and the second photosensitive region B-2 in the same fingerprint recognition device 211 are arranged successively in the column direction. The first direction F1 may also be the row direction, and the first photosensitive region B-1 and the second photosensitive region B-2 in the same fingerprint recognition device 211 are arranged successively in the row direction.

In an implementation and in an embodiment of the disclosure, as shown in FIG. 4, the color arrangement sequences of the photosensitive regions B-n in the fingerprint recognition devices 211 may be same. Exemplarily, the first photosensitive region B-1 and the second photosensitive region B-2 may be arranged sequentially along the first direction (i.e., the direction of the arrow F1) in each fingerprint recognition device 211.

Figure 10:
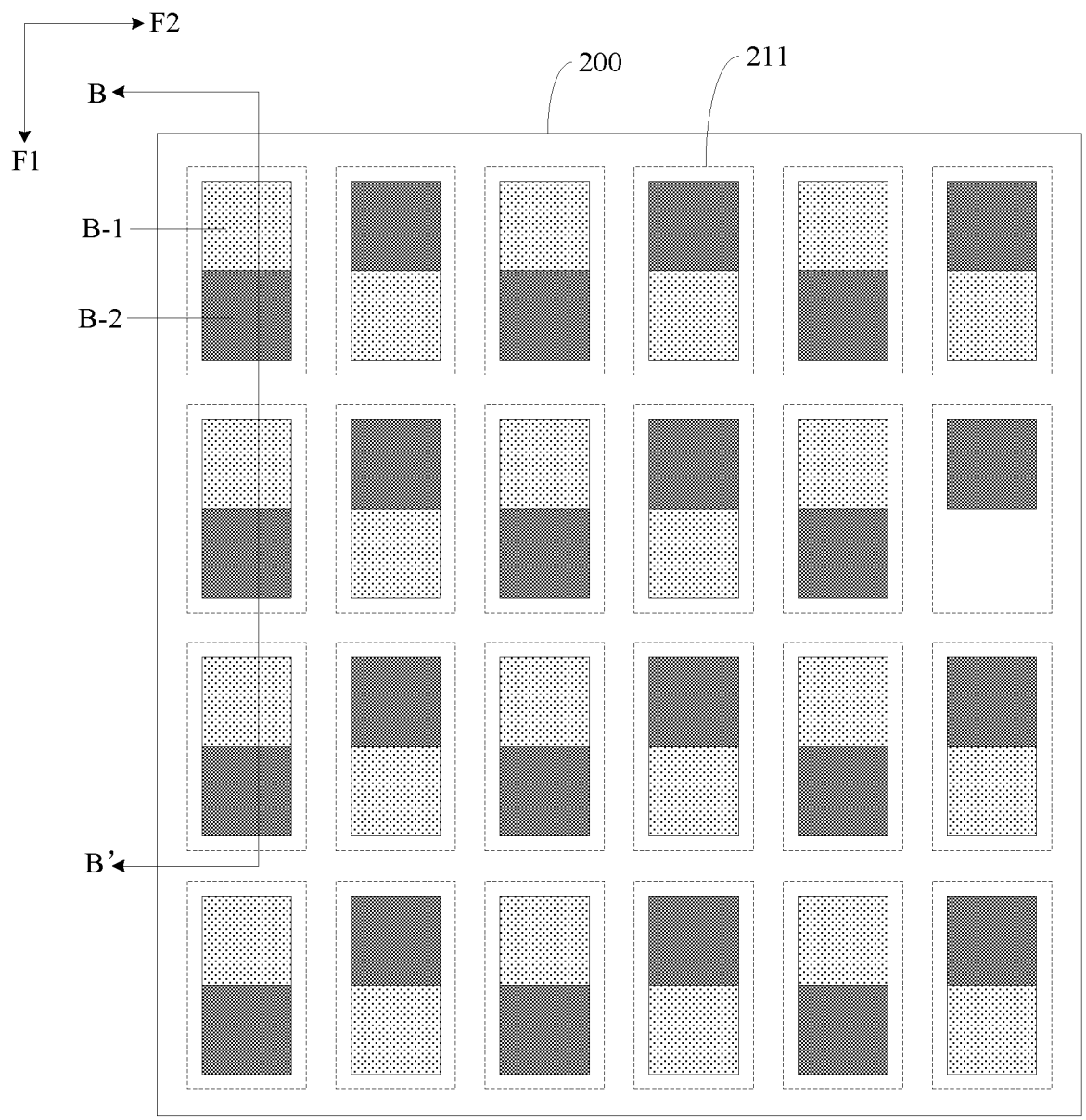
FIG. 10 is a top-view of some other second base substrates according to an embodiment of the disclosure.

In an implementation and in an embodiment of the disclosure, as shown in FIG. 10, the color arrangement sequences of the photosensitive regions in two fingerprint recognition devices 211 adjacent in the first direction F1 are same, and the color arrangement sequences of the photosensitive regions in two fingerprint recognition devices 211 adjacent in the second direction F2 are opposite. The second direction F2 intersects with the first direction F1. Exemplarily, the second direction F2 may be perpendicular to the first direction F1. In one embodiment, the first direction F1 is the column direction and the second direction F2 is the row direction. In the odd-numbered column, the first photosensitive region B-1 and the second photosensitive region B-2 in each fingerprint recognition device 211 are arranged successively in the first direction F1. In the even-numbered column, the second photosensitive region B-2 and the first photosensitive region B-1 in each fingerprint recognition device 211 are arranged successively in the first direction F1. In this way, the photosensitive regions of two colors may be arranged alternately, which can avoid the noise problem such as horizontal stripe due to the different luminance intensities of the light emitting sub-pixels of first color and the light emitting sub-pixels of second color when lightened.

In one embodiment, the first direction F1 may be the row direction and the second direction F2 may be the column direction, which is not limited here.

Figure 5:
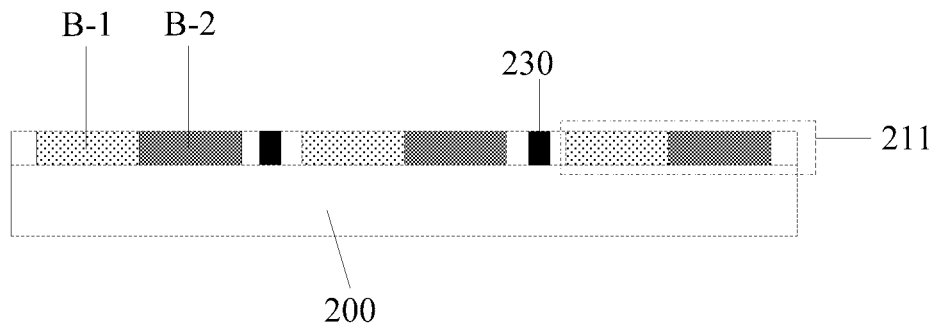
FIG. 5 is a section-view of the second base substrate shown in FIG. 4 along the BB' direction.

In an implementation and in an embodiment of the disclosure, as shown in FIGS. 4 and 5, the display device can further include: a plurality of detection signal lines 230 extending in the third direction F3 and a plurality of detection scan lines 240 extending in the first direction; and the third direction F3 intersects with the first direction F1. And one detection signal line 230 is electrically connected to the corresponding fingerprint recognition devices arranged successively in the third direction F3, and one detection scan line 240 is electrically connected to the corresponding fingerprint recognition devices arranged successively in the first direction F1. Exemplarily, the third direction F3 and the second direction F2 may be the same direction. In one embodiment, the third direction F3 is the row direction, and in each fingerprint recognition device, the source electrode of the detection transistor is electrically connected to the first electrode 2121 of the photosensor 212. The gate electrodes of the detection transistors in a column of fingerprint recognition devices are correspondingly electrically connected to one detection scan line 240, and the drain electrodes of the detection transistors in a row of fingerprint recognition devices are electrically connected to one detection signal line 230. In one embodiment, when the detection scan signal is loaded on the detection scan line 240, the corresponding column of detection transistors can be turned on, so that the electrical signal converted by the photosensor 212 is output to the IC (Integrated Circuit) through the detection signal line 230. Thus the signals of the fingerprint recognition devices may be read per row or per column.

In an implementation and in an embodiment of the disclosure, as shown in FIG. 9, the display device can further include: a second electrode line 260 located between the layer of the photosensors 212 and the color resistance layer 250. The second electrodes 2123 of all the photosensors 212 can be electrically connected to the second electrode line 260, to transmit the voltage signal to each second electrodes 2123 through the second electrode line 260. In an implementation, the voltage signal transmitted by the second electrode line 260 may be a fixed voltage signal, of which the voltage value may be designed and determined according to the practical application environment, which is not limited here.

Further, in an implementation and in an embodiment of the disclosure, the detection transistor may include: an active layer, a gate, a source and a drain. In one embodiment, the active layer is located on the second base substrate, the gate is located at the side of the active layer away from the second base substrate, and a gate insulation layer is arranged between the layer of the gate and the active layer. The source and the drain are arranged in the same layer and located at the side of the gate away from the second base substrate, and an interlayer insulation layer is arranged between the layer of the source and the drain and the layer of the gate. The source and the drain are electrically connected to the active layer respectively through the via holes penetrating through the gate insulation layer and the interlayer insulation layer. A planarization layer is arranged between the layer of the source and the drain and the layer of the first electrode, to make the first electrode, the photoelectric conversion layer and the second electrode planar as much as possible. The buffer layer is arranged among the photosensors, to insulate the different photosensors through the buffer layer. Also a first insulation layer is arranged between the layer of the photosensors and the layer of the second electrode line. A second insulation layer is arranged between the layer of the second electrode line and the color resistance layer.

Further a fingerprint recognition region is generally arranged in the display device, and the fingerprint recognition devices are arranged in the fingerprint recognition region to perform the fingerprint recognition. As shown in FIG. 4, when the fingerprint recognition region is the square region, K rows (e.g., 6 rows) and K columns (e.g., 6 columns) of the photosensitive regions are arranged, and the first photosensitive region B-1 and the second photosensitive region B-2 in the same fingerprint recognition device are arranged in the column direction, the fingerprint recognition devices are arranged in K/2 rows (i.e., 3 rows) and K columns (i.e., 6 columns). Therefore, when the detection signal lines 230 are arranged and extended in the row direction, the number of the detection signal lines 230 can be reduced, In one embodiment, one half of the detection signal lines are removed, so that the more space can be used to arrange the photosensors, further improving the PPI. Of course, the fingerprint recognition region may also be the rectangular region, elliptic region or the like, which is not limited here.

In an implementation and in an embodiment of the disclosure, as shown in FIGS. 1 and 9, the fingerprint recognition structure 210 can further include: a first light-shielding layer 220 located between the layer of the fingerprint recognition devices 211 and the first base substrate 100. The orthographic projection of the first light-shielding layer 220 on the first base substrate 100 is adjoined to the orthographic projection of the color resistance structure 251-*n* on the first base substrate 100. In this way, the light reflected by the finger can be incident into the photoelectric conversion layer only through the photosensitive region by arranging the first light-shielding layer 220. And in the actual preparation process, since the color resistance materials have the certain fluidity, the color resistance materials of different colors may interfere with each other if the first light-shielding layer is not arranged, so that the light received by the photosensitive region is abnormal. In one embodiment, the red color resistance materials flow into the second photosensitive region B-2, and the green color resistance materials are arranged in the second photosensitive region B-2, so that the green light received by second photosensitive region B-2 may be not pure, and causing the decrease in accuracy of the electrical signal converted by the photoelectric converter. Further, the first light-shielding layer is formed at first, and then the color resistance layer is formed. In one embodiment, the thickness of the color resistance layer in the direction perpendicular to the second base substrate can be substantially the same as the thickness of the first light-shielding layer in the direction perpendicular to the second base substrate, to and reduce the thickness of the display device.

In an implementation and in an embodiment of the disclosure, the display device can further include: an adhesion layer located between the color resistance layer and the first base substrate, to attach the second base substrate, provided with the fingerprint recognition devices, to the backlight side of the first base substrate through the adhesion layer. Thus the display device can implement the optical fingerprint recognition function.

Figure 13:
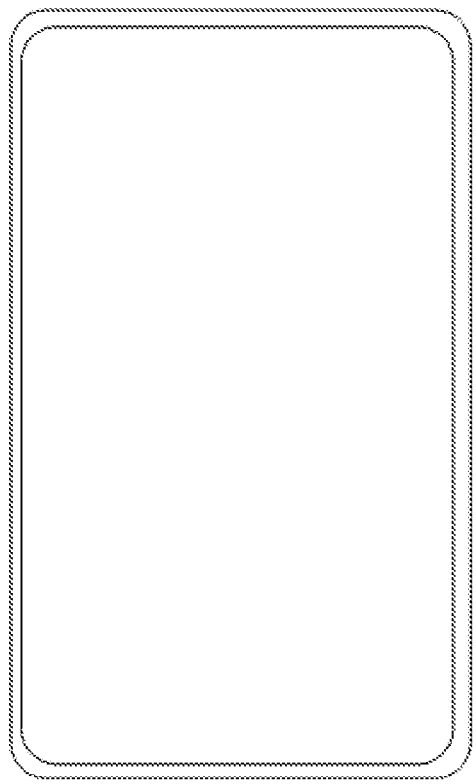
FIG. 13 is a display device according to an embodiment of the disclosure.

In an implementation, the display device provided by the embodiments of the disclosure may be the full screen phone as shown in FIG. 13. Of course, in the practical application, the display device provided by the embodiments of the disclosure may also be a tablet, a television, a display, a laptop, a digital photo frame, a navigator, or any other product or component with display functions.

Figure 11:
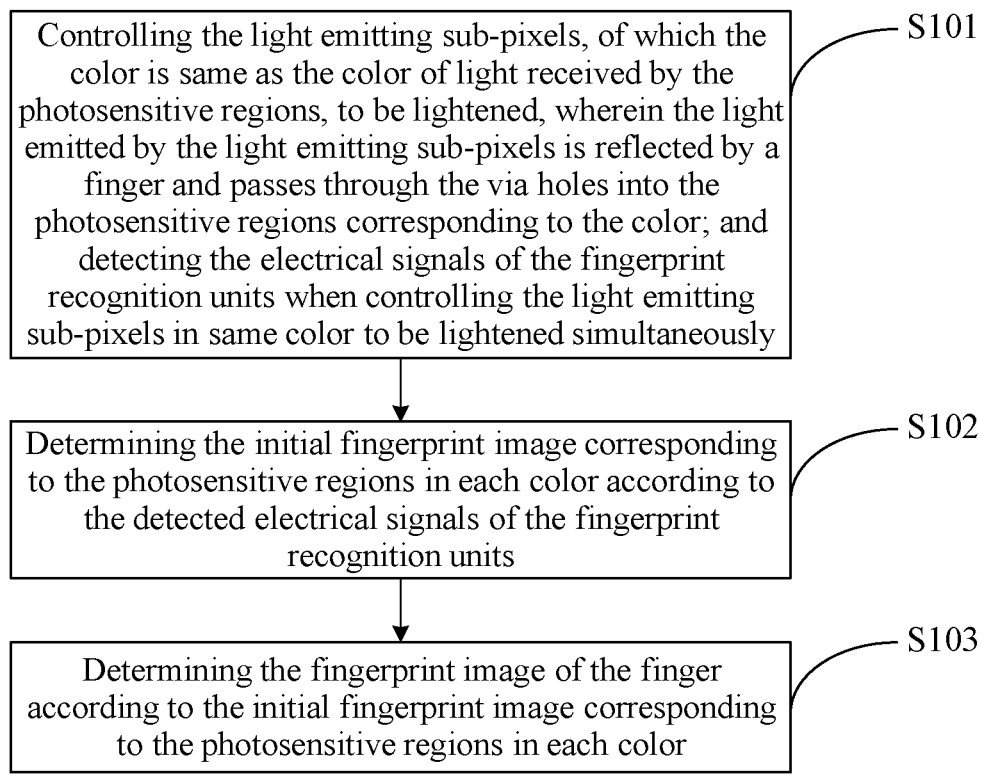
FIG. 11 is a flow chart of a fingerprint recognition method according to an embodiment of the disclosure.

Based upon the same inventive concept, an embodiment of the disclosure further provides a fingerprint recognition method of the display device, as shown in FIG. 11, which can include the following steps.

S101: controlling the light emitting sub-pixels, of which the color is same as the color of light received by corresponding photosensitive region, to be lightened, and the light emitted by the light emitting sub-pixels is reflected by a finger and passes through the via holes into the photosensitive regions corresponding to the color; and detecting the electrical signals of the fingerprint recognition devices when controlling the light emitting sub-pixels in same color to be lightened simultaneously, and the light emitting sub-pixels in same color are lightened at the same time, and the light emitting sub-pixels in different colors are lightened at different time.

S102: determining the initial fingerprint image corresponding to the photosensitive regions in each color according to the detected electrical signals of the fingerprint recognition devices.

S103: determining the fingerprint image of the finger according to the initial fingerprint image corresponding to the photosensitive regions in each color.

In the above display device and fingerprint recognition method provided by the embodiments of the disclosure, each fingerprint recognition device includes at least two photosensitive regions receiving different colors of light, and the color of the light received by one photosensitive region corresponds to the emitted color of the light emitting sub-pixel in one color. When performing the fingerprint recognition, the light emitting sub-pixels of which the color is same as the color of the light received by corresponding photosensitive regions can be controlled to be lightened, so that the photosensitive region in one color receives the light reflected by the finger once and generates an electrical signal once. Also, the light emitting sub-pixels in same color are lightened at the same time, and the light emitting sub-pixels of different colors are lightened at different time. One fingerprint recognition device has N photosensitive regions, so one fingerprint recognition device can receive the light reflected by the finger N times and thus can generates the electrical signals N times. Thus, the effect of N-times fingerprint recognition devices can be achieved by arranging only one fingerprint recognition device without extra addition of the fingerprint recognition devices, to and increase the PPI of the fingerprint recognition and then increase the fingerprint recognition precision.

In an implementation and in an embodiment of the disclosure, controlling the light emitting sub-pixels, of which the color is same as the color of light received by the photosensitive regions, to be lightened, and the light emitted by the light emitting sub-pixels is reflected by a finger, and passes through the via holes into the photosensitive regions corresponding to the color; and detecting the electrical signals of the fingerprint recognition devices when controlling the light emitting sub-pixels in same color to be lightened simultaneously, can includes:

at the first time, controlling the light emitting sub-pixels in first color to be lightened, where the light emitted by the light emitting sub-pixels in first color is reflected by the finger and passes through the via holes into the first photosensitive regions, and detecting the electrical signals of the fingerprint recognition devices corresponding to the first photosensitive regions;

at the second time, controlling the light emitting sub-pixels in second color to be lightened, where the light emitted by the light emitting sub-pixels in second color is reflected by the finger and passes through the via holes into the second photosensitive region, and detecting the electrical signals of the fingerprint recognition devices corresponding to the second photosensitive regions. Thus the light emitting sub-pixels of different colors can be controlled at different times, and the electrical signals of the first and second photosensitive regions can be detected at different times.

Also, in an implementation and in an embodiment of the disclosure, determining the initial fingerprint image corresponding to the photosensitive regions in each color according to the detected electrical signals of the fingerprint recognition devices, can include:

determining the initial fingerprint image corresponding to the first photosensitive regions according to the detected electrical signals corresponding to the first photosensitive regions, and determining the initial fingerprint image corresponding to the second photosensitive regions according to the detected electrical signals corresponding to the second photosensitive regions. Thus the initial fingerprint image corresponding to the first photosensitive regions and the initial fingerprint image corresponding to the second photosensitive regions can be obtained.

Further, In one embodiment when the finger touches the display device, the finger-touched position cannot be seen by the human eyes due to the shielding of the finger. Thus only the light emitting sub-pixels at the finger-touched position may be controlled to emit the light, which can avoid affecting the display effect. In an implementation and in an embodiment of the disclosure, before controlling the light emitting sub-pixels, of which the color is same as the color of light received by the photosensitive regions, to be lightened, the method can further include: acquiring the finger-touched region of the display device touched by the finger. Further, controlling the light emitting sub-pixels, of which the color is same as the color of light received by the photosensitive regions, to be lightened, can include: controlling the light emitting sub-pixels which are located in the finger-touched region and of which the color is same as the color of the light received by the photosensitive regions to be lightened. In this way, the finger-touched region of the display device can be determined at first, and the lightening control is then performed on the light emitting sub-pixels in the finger-touched region, to lighten the light emitting sub-pixels in the finger-touched region, so that the remaining regions may still perform the normal image display when the fingerprint recognition is performed.

In an implementation and in an embodiment of the disclosure, the luminance intensity when the light emitting sub-pixel is lightened may be the predetermined target luminance intensity. In this way, when the fingerprint recognition is performed, each light emitting sub-pixel controlled to be lightened may emit the light at the target luminance intensity, so that the light intensity of the light emitted onto the finger can be uniform as much as possible, to and further avoid the noise problem such as horizontal stripe due to the different luminance intensities.

Figure 12:
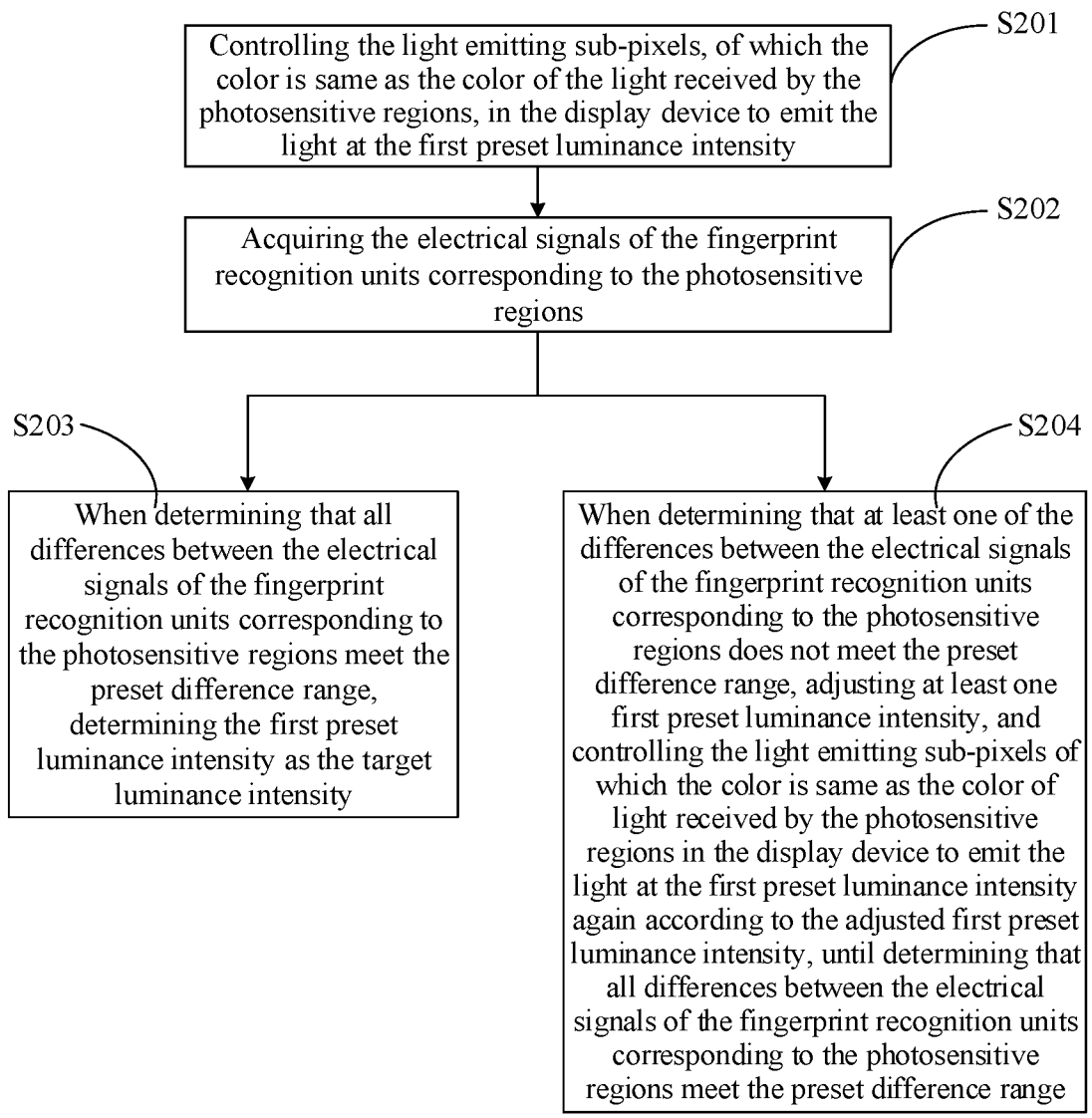
FIG. 12 is a flow chart of a method of determining the predetermined target luminance intensity according to an embodiment of the disclosure.

Exemplarily, as shown in FIG. 12, the method of determining the predetermined target luminance intensity can include the following steps.

S201: controlling the light emitting sub-pixels, of which the color is same as the color of the light received by the photosensitive regions, in the display device to emit the light at the first preset luminance intensity; and the light emitting sub-pixels in same color correspond to the same first preset luminance intensity.

S202: acquiring the electrical signals of the fingerprint recognition devices corresponding to the photosensitive regions.

S203: when determining that all the differences between the electrical signals of the fingerprint recognition devices corresponding to the photosensitive regions meet the preset difference range, determining the first preset luminance intensity as the target luminance intensity.

S204: when determining that at least one of the differences between the electrical signals of the fingerprint recognition devices corresponding to the photosensitive regions does not meet the preset difference range, adjusting at least one first preset luminance intensity, and controlling the light emitting sub-pixels of which the color is same as the color of light received by the photosensitive region in the display device to emit the light at the first preset luminance intensity again according to the adjusted first preset luminance intensity, until determining that all the differences between the electrical signals of the fingerprint recognition devices corresponding to the photosensitive regions meet the preset difference range.

In an implementation and in an embodiment of the disclosure, the preset difference range may be the error tolerance range. Of course, the preset difference range may also be determined empirically in the practical application, which is not limited here.

The process of the fingerprint recognition method provided by the embodiment of the disclosure is listed below by way of embodiments in combination with the structure of the display device, but the reader should understand that the process is not limited thereto.

The display devices as shown in FIGS. 1, 4 and 9 are used as the examples for illustration. The fingerprint recognition method according to the embodiment of the disclosure can include the following steps.

(1) Acquiring the finger-touched region of the display device touched by the finger. Where the finger-touched region of the display device touched by the finger may be acquired by using at least one of the self-capacitive touch detection method, mutual capacitive touch detection method and pressure touch detection method.

(2) Controlling the red light emitting sub-pixel 110-1 located in the finger-touched region to be lightened at the first time, where the luminance intensity of the lightened red light emitting sub-pixel 110-1 is the target luminance intensity. And, the light emitted by the red light emitting sub-pixel 110-1 is reflected by the finger and passes through the via holes 120 into the first photosensitive region B-1. The photosensor 212 in the first photosensitive region B-1 converts the light signal into the electrical signal. The detection scan signal is loaded to each detection scan line 240 per column, to control the detection transistors to be turned on per column. And, when the detection transistors are turned on, the electrical signal corresponding to the first photosensitive region B-1 can be output by the detection signal line 230.

(3) Controlling the green light emitting sub-pixel 110-2 located in the finger-touched region to be lightened at the second time, where the luminance intensity of the lightened green light emitting sub-pixel 110-2 is the target luminance intensity. And, the light emitted by the green light emitting sub-pixel 110-2 is reflected by the finger, and the light reflected by the finger passes through the via holes 120 into the second photosensitive region B-2. The photosensor 212 in the second photosensitive region B-2 converts the light signal into the electrical signal. The detection scan signal is loaded to each detection scan line 240 per column, to control the detection transistors to be turned on per column. And, when the detection transistors are turned on, the electrical signal corresponding to the second photosensitive region B-2 can be output by the detection signal line 230.

(4) Since the electrical signal detected at the first time carries the fingerprint information of the first specific sub-region TB-1 of the fingerprint described above, the initial fingerprint image corresponding to the first photosensitive region B-1 can be determined according to the detected electrical signal corresponding to the first photosensitive region B-1.

And, since the electrical signal detected at the second time carries the fingerprint information of the second specific sub-region TB-2 of the fingerprint described above, the initial fingerprint image corresponding to the second photosensitive region B-2 can be determined according to the detected electrical signal corresponding to the second photosensitive region B-2.

(5) Combining the obtained initial fingerprint images corresponding to the first photosensitive regions B-1 and initial fingerprint images corresponding to the second photosensitive regions B-2, to and determine the fingerprint image of the finger.

When the display devices as shown in FIGS. 1, 10 and 9 are used as the examples for illustration, the fingerprint recognition method provided by the embodiment of the disclosure can refer to the above steps. Since the luminance intensities of the red light emitting sub-pixel 110-1 and the green light emitting sub-pixel 110-2 are controlled to be roughly the same, and the first photosensitive regions B-1 and the second photosensitive regions B-2 are arranged alternately, the light intensity of the light emitted onto the finger can be uniform as much as possible, to and further avoid the noise problem such as horizontal stripe due to the different luminance intensities.

In the display device and the fingerprint recognition method according to the embodiments of the disclosure, each fingerprint recognition device includes at least two photosensitive regions receiving different colors of light, and the color of the light received by one photosensitive region corresponds to the emitted color of the light emitting sub-pixel in a color. When performing the fingerprint recognition, the light emitting sub-pixels, of which the color is same as the color of the light received by the photosensitive region, can be controlled to be lightened, so that the photosensitive region in a color receives the light reflected by the finger once and generates an electrical signal once. One fingerprint recognition device has N photosensitive regions, so one fingerprint recognition device can receive the light reflected by the finger N times and thus can generates the electrical signals N times. Thus, the effect of N-times fingerprint recognition devices can be achieved by arranging only one fingerprint recognition device without extra addition of the fingerprint recognition devices, to and increase the PPI (Pixels Per Inch) of the fingerprint recognition and then increase the fingerprint recognition precision.

What is claimed is:

1. A display device, comprising: a first base substrate and a fingerprint recognition structure located on a backlight side of the first base substrate;
a plurality of light emitting sub-pixels in different colors and a plurality of via holes for pin-hole imaging located on a light-emitting side of the first base substrate;
wherein the fingerprint recognition structure comprises: a plurality of fingerprint recognition devices; wherein at least one of the fingerprint recognition devices comprises: at least two photosensitive regions receiving different colors of light; and a color of light received by one of the photosensitive regions corresponds to an emitted color of a light emitting sub-pixel in one color;
wherein the fingerprint recognition structure further comprises: a second base substrate bearing the fingerprint recognition devices;
at least one of the fingerprint recognition devices comprises: a photosensor and a detection transistor located on the second base substrate;
wherein the fingerprint recognition structure further comprises: a color resistance layer, the color resistance layer comprises at least two color resistance structures of different colors, the at least two color resistance structures correspond to different photosensitive regions, and an orthographic projection of one photosensor on the first base substrate overlaps with orthographic projections of the at least two color resistance structures in a color resistance unit on the first base substrate.

2. The display device of claim 1, wherein the photosensor comprises: a first electrode, a photoelectric conversion layer and a second electrode stacked on the second base substrate;
in the same fingerprint recognition device, an orthographic projection of the photoelectric conversion layer on the second base substrate covers the orthographic projections of the at least two photosensitive regions on the second base substrate.

3. The display device of claim 1, wherein the color resistance layer is located between a layer of the fingerprint recognition devices and the first base substrate;
the color resistance structures are one-to-one corresponding to the photosensitive regions; wherein a color of the color resistance structure is the same as the color of the light received by the corresponding photosensitive region, and an orthographic projection of the color resistance structure on the first base substrate covers an orthographic projection of the corresponding photosensitive region on the first base substrate.

4. The display device of claim 3, wherein the fingerprint recognition structure further comprises: a first light-shielding layer located between the layer of the fingerprint recognition devices and the first base substrate;
an orthographic projection of the first light-shielding layer on the first base substrate is adjoined to the orthographic projection of the color resistance structure on the first base substrate.

5. The display device of claim 1, wherein the photosensitive regions in the plurality of fingerprint recognition devices are arranged in an array; and the photosensitive regions in a same fingerprint recognition device are arranged successively in a first direction.

6. The display device of claim 5, wherein an arrangement sequence of color of the photosensitive regions in the fingerprint recognition devices are same.

7. The display device of claim 5, wherein an arrangement sequence of colors of the photosensitive regions in two fingerprint recognition devices adjacent in the first direction are same, and an arrangement sequence of the colors of the photosensitive regions in two fingerprint recognition devices adjacent in a second direction are opposite; wherein the second direction intersects with the first direction.

8. The display device of claim 5, further comprising: a plurality of detection signal lines extending in a third direction and a plurality of detection scan lines extending in the first direction; wherein the third direction intersects with the first direction;

one of the detection signal lines is electrically connected to corresponding fingerprint recognition devices arranged successively in the third direction, and one of the detection scan lines is electrically connected to corresponding fingerprint recognition devices arranged successively in the first direction.

9. The display device of claim 1, wherein areas of the photosensitive regions are substantially same.

10. The display device of claim 1, wherein the light emitting sub-pixels comprise: light emitting sub-pixels in a first color, light emitting sub-pixels in a second color, and light emitting sub-pixels in a third color; and the fingerprint recognition device has a first photosensitive region and a second photosensitive region; wherein a color of light received by the first photosensitive region corresponds to an emitted color of the light emitting sub-pixels in the first color, and a color of light received by the second photosensitive region corresponds to an emitted color of the light emitting sub-pixels in the second color.

11. The display device of claim 10, wherein the first color is red, and the second color is green.

12. The display device of claim 1, wherein orthographic projections of the via holes on the first base substrate do not overlap with orthographic projections of the light emitting sub-pixels on the first base substrate.

13. The display device of claim 1, further comprising: a second light-shielding layer located between a layer of the light emitting sub-pixels and the first base substrate; the second light-shielding layer is provided with the via holes;

an orthographic projection of the second light-shielding layer on the first base substrate covers orthographic projections of the light emitting sub-pixels on the first base substrate.

14. A fingerprint recognition method of a display device, the display device comprising:

a first base substrate and a fingerprint recognition structure located on a backlight side of the first base substrate; a plurality of light emitting sub-pixels in different colors and a plurality of via holes for pin-hole imaging located on a light-emitting side of the first base substrate; wherein the fingerprint recognition structure comprises: a plurality of fingerprint recognition devices; wherein at least one of the fingerprint recognition devices comprises: at least two photosensitive regions receiving different colors of light; and a color of light received by one of the photosensitive regions corresponds to an emitted color of a light emitting sub-pixel in one color, wherein the method comprises:

controlling light emitting sub-pixels, of which the color is same as the color of light received by corresponding photosensitive regions, to be lightened, wherein light emitted by the light emitting sub-pixels is reflected by a finger and passes through the via holes into the photosensitive regions corresponding to the color; and detecting electrical signals of the fingerprint recognition devices when controlling light emitting sub-pixels in same color to be lightened simultaneously, wherein the light emitting sub-pixels in same color are lightened at same time, and light emitting sub-pixels in different colors are lightened at different time;

determining an initial fingerprint image corresponding to the photosensitive regions in each color according to the detected electrical signals of fingerprint recognition devices;

determining a fingerprint image of the finger according to the initial fingerprint image corresponding to the photosensitive regions in each color;

wherein a luminance intensity of the lightened light emitting sub-pixels is a predetermined target luminance intensity;

wherein the predetermined target luminance intensity is determined by:

controlling the light emitting sub-pixels of which the color is same as the color of light received by corresponding photosensitive regions in the display device to emit the light at a first preset luminance intensity; wherein the light emitting sub-pixels in same color correspond to a same first preset luminance intensity;

acquiring electrical signals of the fingerprint recognition devices corresponding to the photosensitive regions;

when determining all differences between electrical signals of the fingerprint recognition devices corresponding to the photosensitive regions meet a preset difference range, determining the first preset luminance intensity as the target luminance intensity;

when determining that at least one of the differences between the electrical signals of the fingerprint recognition devices corresponding to the photosensitive regions does not meet the preset difference range, adjusting at least one first preset luminance intensity, and controlling the light emitting sub-pixels of which the color is same as the color of light received by the photosensitive regions in the display device to emit the light at a first preset luminance intensity again according to an adjusted first preset luminance intensity, until determining that all differences between electrical signals of the fingerprint recognition devices corresponding to the photosensitive regions meet the preset difference range.

15. The fingerprint recognition method of claim 14, wherein the controlling light emitting sub-pixels of which the color is same as the color of light received by corresponding photosensitive regions to be lightened, wherein the light emitted by the light emitting sub-pixel is reflected by a finger and passes through the via holes into the photosensitive regions corresponding to the color; and detecting an electrical signal of the fingerprint recognition devices when controlling light emitting sub-pixels of same color to be lightened simultaneously, comprises:

at first time, controlling light emitting sub-pixels in a first color to be lightened, wherein the light emitted by the light emitting sub-pixels in the first color is reflected by the finger and passes through the via holes into a first photosensitive regions, and detecting electrical signals of the fingerprint recognition devices corresponding to the first photosensitive regions;

at second time, controlling light emitting sub-pixels in a second color to be lightened, wherein the light emitted by the light emitting sub-pixels in the second color is reflected by the finger and passes through the via holes into a second photosensitive regions, and detecting an electrical signal of the fingerprint recognition devices corresponding to the second photosensitive regions;

the determining an initial fingerprint image corresponding to the photosensitive regions in each color according to the detected electrical signal of the fingerprint recognition devices, comprises:

determining an initial fingerprint image corresponding to the first photosensitive regions according to the detected electrical signals corresponding to the first photosensitive regions, and determining an initial fingerprint image corresponding to the second photosensitive regions according to the detected electrical signals corresponding to the second photosensitive regions.

16. The fingerprint recognition method of claim 15, wherein before controlling the light emitting sub-pixels of which the color is same as the color of light received by the corresponding photosensitive regions to be lightened, the fingerprint recognition method further comprises:
acquiring a finger-touched region of the display device touched by the finger;
the controlling light emitting sub-pixels of which the color is same as the color of light received by corresponding photosensitive regions to be lightened, comprises:
controlling the light emitting sub-pixels which are located in the finger-touched region and of which the color is same as the color of light received by the corresponding photosensitive regions to be lightened.

17. The fingerprint recognition method of claim 14, wherein before controlling the light emitting sub-pixels of which the color is same as the color of light received by the corresponding photosensitive regions to be lightened, the fingerprint recognition method further comprises:
acquiring a finger-touched region of the display device touched by the finger;
the controlling light emitting sub-pixels of which the color is same as the color of light received by corresponding photosensitive regions to be lightened, comprises:
controlling the light emitting sub-pixels which are located in the finger-touched region and of which the color is same as the color of light received by the corresponding photosensitive regions to be lightened.

* * * * *